US006956788B1

(12) United States Patent
Nguyen et al.

(10) Patent No.: US 6,956,788 B1
(45) Date of Patent: Oct. 18, 2005

(54) ASYNCHRONOUS DATA STRUCTURE FOR STORING DATA GENERATED BY A DSP SYSTEM

(75) Inventors: Hung Nguyen, Plano, TX (US); Keith Dang, Carrollton, TX (US)

(73) Assignee: LSI Logic Corporation, Milpitas, CA (US)

( * ) Notice: Subject to any disclaimer, the term of this patent is extended or adjusted under 35 U.S.C. 154(b) by 125 days.

(21) Appl. No.: 10/701,775

(22) Filed: Nov. 5, 2003

(51) Int. Cl.[7] ............................................. G11C 8/00
(52) U.S. Cl. .................. 365/233; 365/221; 365/189.01
(58) Field of Search ................................ 365/233, 221, 365/189.01, 189.05

(56) References Cited

U.S. PATENT DOCUMENTS 6,525,980 B1 * 2/2003 Au et al. ..................... 365/221

* cited by examiner

*Primary Examiner*—David Lam
(74) *Attorney, Agent, or Firm*—Daffer McDaniel, LLP

(57) ABSTRACT

In some embodiments, a system includes a memory device in a first clock domain region and a memory device and a digital signal processing (DSP) sub-system in a second clock domain region. In addition, a plurality of asynchronous first-in first-out (FIFO) data structures, each comprising a read interface, a write interface, and one or more data slots, store data generated from the DSP sub-system. The read interface operates in the first clock domain, and the write interface operates in the second clock domain.

20 Claims, 3 Drawing Sheets

ASYNCHRONOUS DATA STRUCTURE FOR STORING DATA GENERATED BY A DSP SYSTEM

BACKGROUND OF THE INVENTION

1. Field of the Invention

This invention relates to computer systems and, more particularly, to asynchronous data transfers between computer subsystems clocked at dissimilar clock rates by using a first-in-first-out (FIFO) buffer having a read interface, a write interface, and one or more data slots.

2. Description of Related Art

Some types of electrical systems operate in multiple "clock domains." Each clock domain is associated with a clock signal that operates at a distinct frequency. For example, a microprocessor may possess a core clock domain and a secondary clock domain. The core clock domain may be associated with a core clock signal that operates at a higher frequency than a secondary clock signal associated with the secondary clock domain. Within the core clock domain, hardware components, such as memory controllers and serializers, may operate at the frequency associated with the core clock. Within the secondary clock domain, other hardware components, such as external memory units and controllers, may operate at the frequency associated with the secondary clock.

To facilitate communication between hardware components operating in different clock domains, data may be transferred from a first clock domain to a second clock domain using the higher frequency clock signal to synchronize the transfer. For example, a first clock domain may operate at 200 megahertz (MHz) and a second clock domain may operate at 100 MHz. Data may be transferred between the first and second clock domains by generating a clock enable signal based on the clock signal associated with the higher frequency, first clock domain. The clock enable signal typically indicates when the rising edges of the first and second clocks are aligned. Thus, data transferred using the clock enable signal is said to be "synchronized" with both clock signals, thereby enabling proper transmission of data.

However, synchronizing data transfers in the preceding manner may not permit the hardware components to send and receive data at a desired rate. In addition, various meta-stability issues may arise when transferring data in the described manner. For example, setup and hold times associated with various logic components, such as flip-flops and registers, may be violated while synchronizing a transfer, thereby causing unreliable results. Overcoming the meta-stabililty issues and the undesirable transfers rates associated with data transfers between multiple clock domains has yet to be resolved.

SUMMARY OF THE INVENTION

In some embodiments, a system includes a first memory device in a first clock domain region and a second memory device and a digital signal processing (DSP) sub-system in a second clock domain region. In addition, a plurality of asynchronous first-in first-out (FIFO) data structures, each comprising a read interface, a write interface, and one or more data slots, store data generated from the DSP sub-system. The read interface operates in the first clock domain, and the write interface operates in the second clock domain.

BRIEF DESCRIPTION OF THE DRAWINGS

For a detailed description of embodiments of the invention, reference will now be made to the accompanying drawings in which.

BRIEF DESCRIPTION OF PREFERRED EMBODIMENTS

Certain terms are used throughout the following description. As one skilled in the art will appreciate, computer companies may refer to a component by different names. This document does not intend to distinguish between components that differ in name but not function. In the following discussion and in the claims, the terms "including" and "comprising" are used in an open-ended fashion, and thus should be interpreted to mean "including, but not limited to . . . ". Also, the term "couple" or "couples" is intended to mean either an indirect or direct electrical connection. Thus, if a first device couples to a second device, that connection may be through a direct electrical connection, or through an indirect electrical connection via other devices and connections. Unless otherwise explicitly indicated, embodiments discussed herein should be construed as exemplary, and not limiting in scope.

The following discussion is directed to various embodiments of the invention. Although one or more of these embodiments may be preferred, the embodiments disclosed should not be interpreted, or otherwise used, as limiting the scope of the disclosure, including the claims. In addition, one skilled in the art will understand that the following description has broad application, and the discussion of any embodiment is meant only to be exemplary of that embodiment, and not intended to intimate that the scope of the disclosure, including the claims, is limited to that embodiment.

Figure 1:
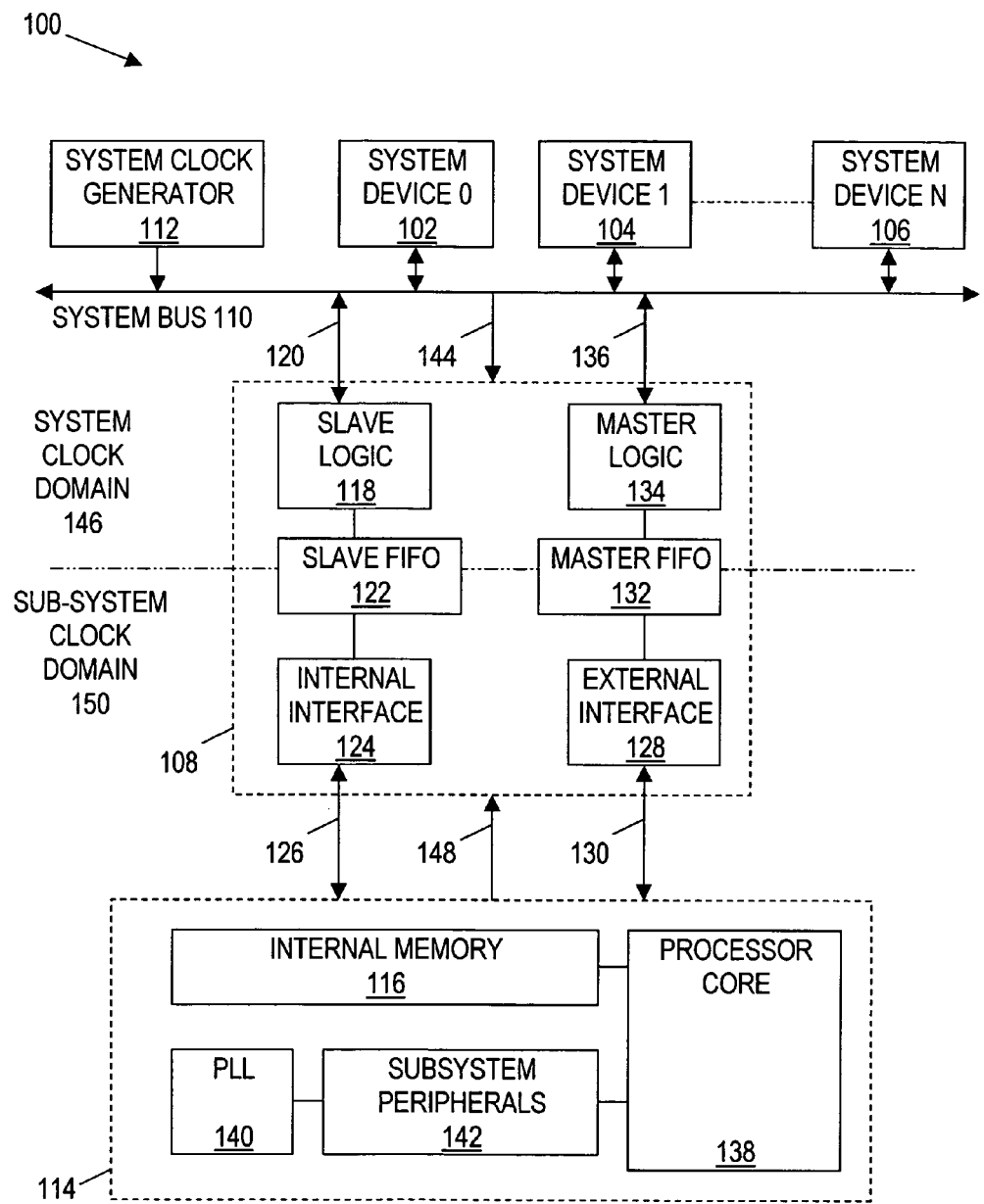
FIG. 1 shows an electronic system in accordance with preferred embodiments of the invention, including a slave and a master first-in-first-out (FIFO) data structure.

Referring now to FIG. 1, an electronic system 100, configured in accordance with preferred embodiments, may include system devices 102, 104, and 106 coupled to a system bus interface 108 via a system bus 110. The system bus 110 preferably comprises a plurality of signal lines over which data and address signals may be transferred between the system devices 102, 104, and 106 and the system bus interface 108. Although three system devices 102, 104, and 106 are shown in FIG. 1, any number of system devices may be included as desired. The system devices 102, 104, and 106 may represent a variety of hardware devices, such as external memory units, processors or co-processors, special-purpose application specific integrated circuits (ASICs), and memory controllers. Each system device 102, 104, and 106 may include an associated memory unit in the form of random access memory (RAM) or read only memory (ROM) (not specifically shown) to store data. In addition, a system clock generator 112, coupled to the system bus 110, may create a clock pulse signal that establishes the operating frequency associated with the system devices 102, 104, and 106.

The system bus interface 108 preferably acts as an interface between the system bus 110 and an electronic subsystem 114 by exchanging "requests" and "replies" between the system bus 110 and the sub-system 114. A request comprises one or more data and address signals that represent an operation, such as a read or write, to a memory unit, whereas a reply comprises one or more data signals generated in response to a request. For example, a request may be generated by the system device 102 and may represent a read operation from an internal memory unit 116 that is included in the sub-system 114. The request may include a data signal uniquely identifying the operation as a read operation and an address signal indicating which portion of the internal memory 116 that is desired to be read from. The corresponding reply to the request may include a data signal containing data from the internal memory 116 at the address specified in the request and a data signal representing the successful completion of the request.

The system bus interface 108 may handle "master" and "slave" requests from the perspective of sub-system 114. Master requests are generated by the sub-system 114 and may represent operations to a memory unit coupled to the system devices 102, 104, and 106. Slave requests are generated by the system devices 102, 104, and 106 and may represent operations to memory units included in the sub-system 114, such as the internal memory unit 116.

System devices 102, 104, and 106 may generate and place slave requests onto the system bus 110 at any desired time. A slave logic unit 118, included in the system bus interface 108, may continually monitor the system bus 110 and transfer the requests from the system bus 110 to the system bus interface 108 via a slave port 120. The slave port 120, coupling the system bus 110 to the system bus interface 108, facilitates the transfer of slave requests by converting, if necessary, slave requests on the system bus 110 that are encoded with a first protocol to and from a protocol supported by the system bus interface 108. Numerous token-passing and other suitable protocols may be employed in various components of the system 100 as desired by the system architect.

After transferring a slave request from the system bus 110 to the system bus interface 108, the slave logic unit 118 preferably stores the request in a slave first-in first-out ("FIFO") data structure 122 that is included in the system bus interface 108. The slave FIFO 122 is a temporary storage location for storing slave requests and replies in a serial, first-in first-out fashion. Once stored in the slave FIFO 122 by the slave logic unit 118, a slave request may remain in the slave FIFO 122 until an internal memory interface 124, also included in the system bus interface 108, retrieves the request and transfers the request to the sub-system 114 via an internal memory port 126. The internal memory port 126, coupling the system bus interface 108 with the sub-system 114, may convert, if necessary, slave requests and replies to and from a protocol supported by the sub-system 114.

After receiving the request from the internal memory interface 124, the sub-system 114 may "service" a slave request by performing the associated operation (e.g., a read or write) to the internal memory unit 116. After performing the associated operation, the sub-system 114 may send a reply back through the internal memory port 126 to the internal memory interface 124, thereby completing the service associated with the slave request. The internal memory interface 124 may store the reply in the slave FIFO 122 where the reply may remain until the slave request logic unit 118 retrieves the reply from the slave FIFO 122 and transfers the reply to the system bus 110 via the slave port 120. The system device 102, 104, or 106 that generated the slave request may receive the corresponding reply from the system bus 110.

The sub-system 114 may generate a master request at any desire time and send the request to an external memory interface 128, included in the system bus interface 108, via an external memory port 130. The external memory port 130, coupling the sub-system 114 to the system bus interface 108, facilitates data exchange by converting, if necessary, master requests that are encoded with a first protocol to and from a protocol supported by the system bus interface 108.

Upon receiving a master request, the external memory interface 128 may store the master request into a master FIFO 132. The master FIFO 132 is a temporary storage location, similar to the slave FIFO 122, but for storing master requests and replies. Once placed in the master FIFO 132 by the external memory interface 128, a master request may remain in the master FIFO 132 until a master request logic unit 134, included in the system bus interface 108, retrieves the request and transfers the request to the system bus 110 via a master port 136. The master port 136, coupling the system bus interface 108 to the system bus 110, may convert, if necessary, master requests and replies to and from a protocol supported by the system bus 110.

The designated system device 102, 104, or 106 associated with the master request may service the request by receiving the request from the system bus 110 and performing the associated operation (e.g., a read or write) to the appropriate memory unit coupled to the system devices 102, 104, and 106. After performing the associated operation, the system device 102, 104, or 106 that services the request may send a reply onto the system bus 110, and the master request logic unit 134, continually monitoring the system bus 110, may detect and receive the reply via the master port 136. After receiving the reply from the system bus 110, the master request logic 134 may store the reply in the master FIFO 132 where the reply may remain until the external memory interface 128 retrieves the reply from the master FIFO 132. The external memory interface 128 then may transfer the reply to the sub-system 114 via the external memory port 130.

Referring again to FIG. 1, the sub-system 114 preferably comprises a processor core 138 for executing instructions, an internal memory unit 116 for storing data, and a phase locked loop (PLL) circuit 140 for stabilizing or generating a clock pulse. In addition, one or more subsystem peripherals 142, such as a debugging unit, a device emulation unit, and an interrupt control unit, may be included as desired. In some embodiments, the internal memory unit 116 may comprise multiple distinct memory units. For example, a first internal memory unit may comprise instruction memory, whereas a second internal memory unit may comprise data memory. If multiple memory units are provided, a processing core (not specifically shown) may be associated with the first and second internal memory units to control and perform management functions (e.g., memory flushing, memory translation) on the associated memory units.

The system clock generator 112 and the phase locked loop circuit 140 preferably control the timing of the electronic system 100. As previously stated, the system clock generator 112 may create a clock pulse that establishes the timing for the system devices 102, 104, and 106. In addition, the clock pulse created by system clock generator 112 may establish the timing for the slave bus logic unit 118 and the master request logic unit 134 via a clock signal 144 that couples the system bus 110 with the system bus interface 108. All devices operating from the clock signal generated by system clock generator 112 may be said to operate in the "system clock domain" 146.

The phase locked loop circuit 140 preferably creates a secondary clock that establishes the timing for the sub-system 114. In addition, the clock pulse created by the phase locked loop circuit 140 may establish the timing of the internal memory interface 124 and the external memory interface 128 via a clock pulse 148 that couples the sub-system 114 with the system bus interface 108. All devices operating from the clock signal generated by the phase locked loop circuit 140 may be said to operate in the "sub-system clock domain" 150. In some embodiments, the phase locked loop circuit 140 may locked onto the clock pulse generated by the system clock generator 112 to generate the clock pulse associated with the sub-system clock domain 150.

The slave FIFO 122 and the master FIFO 132 preferably operate in both the system clock domain 146 and the sub-system clock domain 150 as shown. More specifically, slave requests may be stored in the slave FIFO 122 by the slave logic unit 118 that operates in the system clock domain 146, whereas corresponding replies to the requests may be may be stored in the slave FIFO 122 by the internal memory interface 124 that operates in the sub-system clock domain 150. Accordingly, master requests may be stored in the master FIFO 132 by the external memory interface 128 that operates in the sub-system clock domain 150, whereas corresponding replies to the requests may be stored in master FIFO 132 by the master request logic unit 134 that operates in the system clock domain 146.

The exemplary system 100 may be representative of a processor, such as a digital signal processor ("DSP"), a computer system, or any type of device or system that may be characterized by the preceding description.

Figure 2:
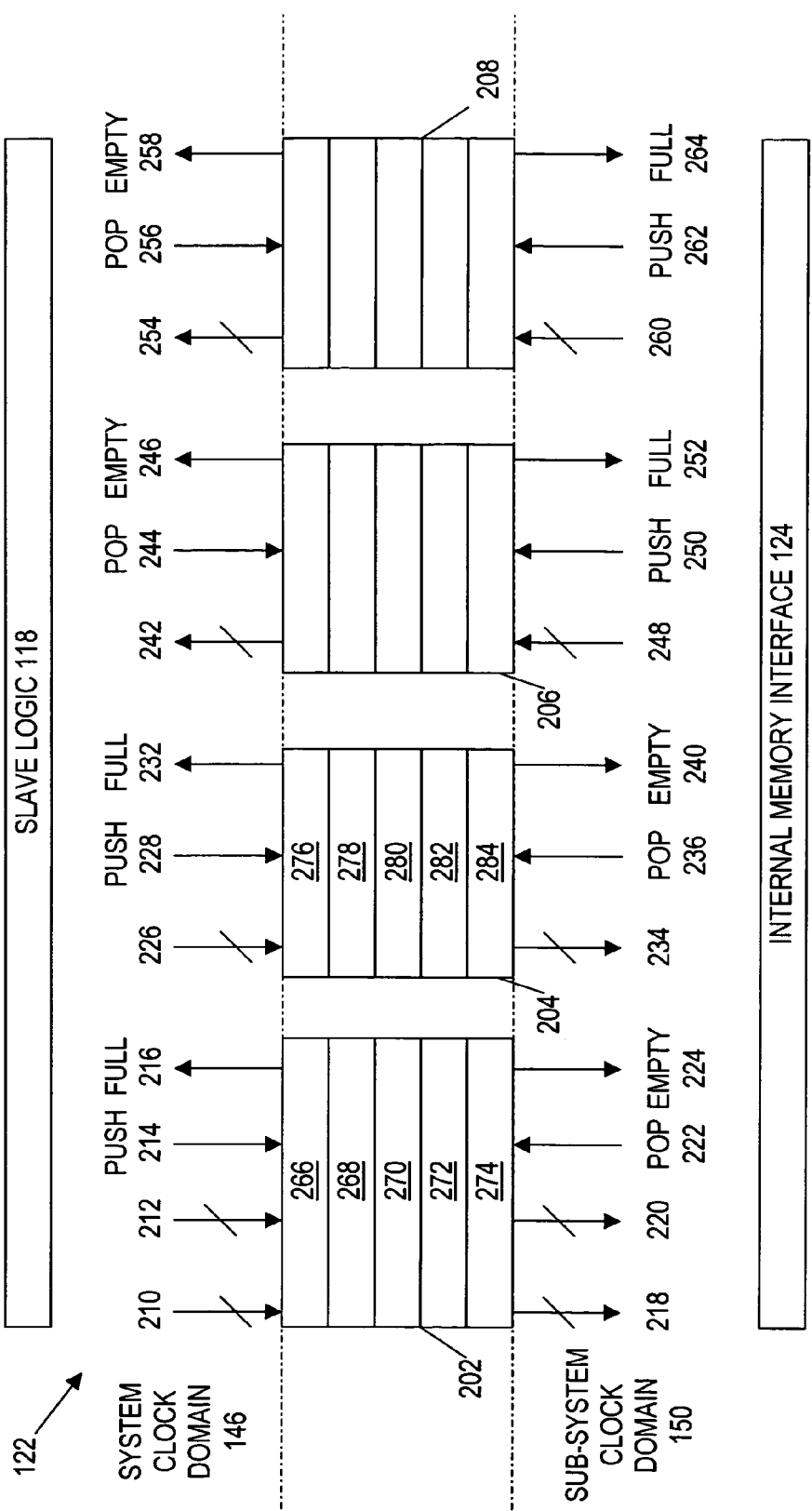
FIG. 2 shows an exemplary configuration of the slave FIFO of FIG. 1.

Referring now to FIGS. 1 and 2, an exemplary configuration of the slave FIFO 122 (FIG. 1) is shown. The slave FIFO 122 is preferably divided into four independent FIFO data structures, a command FIFO 202, a write data FIFO 204, a response FIFO 206, and a read data FIFO 208 as shown in FIG. 2. The command FIFO 202 and write data FIFO 204 may store slave requests, whereas the response FIFO 206 and the read data FIFO 208 may store corresponding replies to the slave requests.

Each FIFO 202, 204, 206, and 208 preferably is capable of storing one or more slave requests and corresponding replies in data "slots." Although any number of data slots may be used as desired, each FIFO 202, 204, 206, and 208 may possess five data slots as shown. Thus, if a one-to-one correspondence between data slots and slave requests exists, five slave requests and the five corresponding replies may be stored simultaneously in FIFOs 202, 204, 206, and 208. In some embodiments, each data slot may hold multiple slave requests or replies, thereby producing a one-to-many correspondence between the data slots and slave requests or replies.

Each FIFO 202, 204, 206, and 208 preferably includes two associated status signal lines that indicate when the respective FIFO 202, 204, 206, and 208 is full (i.e., all data slots are storing data) or empty (i.e., no data slots are storing data). The slave logic unit 118 and the internal memory interface 124 may monitor full signal lines and empty signal lines to determine when a request or reply may be stored in and retrieved from the FIFOs 202, 204, 206, and 208.

In addition, each FIFO 202, 204, 206, and 208 preferably comprises a pop signal line and a push signal line. Asserting a push signal line may store data into a data slot, whereas asserting a pop signal line may retrieve stored data from a data slot. For example, a 5-kilobyte FIFO may comprise five 1-kilobyte data slots, a pop signal line, a push signal line, an input, and an output. Data placed on the input may be stored into a data slot by asserting the push signal line, and data may be retrieved from a data slot and sent to the output by asserting the pop signal line. Since a first-in first-out ordering of the data slots is maintained, asserting the pop signal line retrieves data from the least recently pushed (i.e., the oldest) data slot. The least recently pushed data slot may be referred to as the "head" data slot. Accordingly, most recently pushed data slot may be referred to as the "tail" data slot. Thus, data that is stored into the FIFOs 202, 204, 206, and 208 by asserting a push signal line is stored into the tail data slot.

Slave requests and replies may be stored into the FIFOs 202, 204, 206, and 208 in a serial manner. Thus, the internal memory interface 124 may not pop an additional slave request off the slave FIFO 122 until the current request is serviced and a corresponding reply has been stored into the slave FIFO 122. Since the slave FIFO 122 operates in both clock domains 146 and 150, slave requests and corresponding replies may be stored into and retrieved from the salve FIFO 122 as soon as the slave logic unit 118 and the internal memory interface 124 are capable of doing so.

Referring again to FIG. 2, the command FIFO 202 may comprise a operation identifier input 210, an address input 212, a push signal line 214, and a full signal line 216 that are all coupled to the slave logic unit 118. In addition, the command FIFO 202 comprises five data slots 266–274. As previously discussed, a slave request may comprise a data signal that identifies the operation associated with the request and an address signal that comprises the address associated with the operation. When storing a request in the slave FIFO 122, the slave logic unit 118 may place the associated data signal onto the operation identifier input 210 and the associated address signal onto the address input 212. If the full signal line 216 indicates that the command FIFO 202 is not full, the data and address signals may be stored into tail data slot 266 of command FIFO 202 when the slave logic unit 216 asserts (i.e., sets to a high voltage value) the push signal line 214.

For some operations (e.g., a write) an additional data signal may be included in the slave request. As previously mentioned, the additional data signal may comprise data that is to be written to a memory unit. For these operations, the write data FIFO 204 may be used to stored the additional data signal. The write data FIFO 204 comprises a write data input 226, a push signal line 228, and a full signal line 232 that are all coupled to the slave logic unit 118. The slave logic unit 118 may place the additional data signal onto the write data input 226 when the full signal line 232 indicates that the write data FIFO 204 is not full. The push signal line 228 may be asserted by the slave logic unit 118, causing the additional data signal to be stored into tail data slot 276.

When the sub-system 114 (FIG. 1) is capable of servicing a slave request, a request may be retrieved from the slave FIFO 122 by the internal memory interface 124. More specifically, the command FIFO 202 comprises a operation identifier output 218, an address output 220, a pop signal line 222, and an empty signal line 224 that are all coupled to the internal memory interface 124. If the empty signal line 224 indicates that the command FIFO 202 is not empty, the internal memory interface 124 may assert the pop signal line 222 to retrieve the data and address signal associated with a slave request that are stored in the head data slot 274. In response to asserting the pop signal line 222, the data and address signals stored in the head data slot 274 may appear on the operation identifier output 218 and the address output 220 respectively.

For some operations (e.g., a write) an additional data signal may be included in the slave request. For these operations, the write data FIFO 204 may be used to store the additional data signal. The write data FIFO 204 comprises a write data output 234, a pop signal line 236, and an empty signal line 240 that are all coupled to the internal memory interface 124. In addition, the write data FIFO 204 comprises five data slots 276–284. If the empty signal line 240 indicates that the write data FIFO 204 is not empty, the internal memory interface 124 may assert the pop signal line 236 to retrieve the data signal stored in the head data slot 284. In response to asserting the pop signal line 236, the data signal stored in the head data slot 284 may appear on the write data output 234.

After servicing a slave request, the sub-system 114 may generate a reply, as previously discussed. The reply comprises a data signal indicating a response (e.g., successful completion) to the corresponding request. The reply may be stored into the slave FIFO 122 in a similar fashion as the request. However, the response FIFO 206 and the read data FIFO 208 may be used to store the reply.

The response FIFO 206 may comprise a response input 248, a push signal line 250, and a full signal line 252 that are coupled to the internal memory interface 124. When storing a reply in the slave FIFO 122, the slave logic unit 118 may place the data signal indicating the response onto the response input 248. If the full signal line 252 indicates that the response FIFO 206 is not full, the data signal may be stored into the response FIFO 206 when the internal memory interface 124 asserts the push signal line 250.

To retrieve the reply, the response FIFO 206 also comprises a response output 242, a pop signal line 244, and an empty signal line 246 that are coupled to the slave logic 118. If the empty signal line 246 indicates that the response FIFO 206 is not empty, the slave logic unit 118 may assert the pop signal line 244 to retrieve the data signal stored in response FIFO 206. In response to asserting the pop signal line 244, the data signal may appear on the response output 242.

For some operations (e.g., a read) an additional data signal, comprising read data in response to a request, may be included in the reply. For these operations, the read data FIFO 208 may be used to stored the additional data signal. The read data FIFO 208 comprises a read data input 260, a push signal line 262, and a full signal line 264 that are all coupled to the internal memory interface 124. In addition, the read data FIFO 208 may comprise a read data output 254, a pop signal line 256, and an empty signal line 258 are coupled to the slave logic unit 118. If the full signal line 264 indicates that the read data FIFO 208 is not full, the additional data signal may be stored into the read data FIFO 208 when the internal memory interface 124 asserts the push signal line 262. If the empty signal line 258 indicates that the read data FIFO 208 is not empty, the additional data signal may be retrieved from the read data FIFO 208 when the slave logic unit 118 asserts the pop signal line 256.

The master FIFO 132 (FIG. 1) may store master requests generated by the sub-system 114 and replies to master requests in a similar fashion. For master requests, the external memory interface 128 may be responsible for asserting the push signal lines and the master logic unit 134 may be responsible for asserting the pop signal lines. For replies to master requests, the master logic unit 134 may be responsible for asserting the push signal lines and the external memory interface 128 may be responsible for asserting the pop signal lines.

In some embodiments, the master FIFO 132 may comprise two sets of FIFOs, one for each type (e.g., instruction and data) of internal memory unit. In addition, although four independent FIFOs were used in the exemplary discussion of the salve FIFO 122, more or less FIFOs may be similarly used for the master or slave FIFOs to increase or decrease functionally as desired. For example, if all operations are expected to be reads, the write data FIFO 204 (FIG. 2) may not be included.

Figure 3:
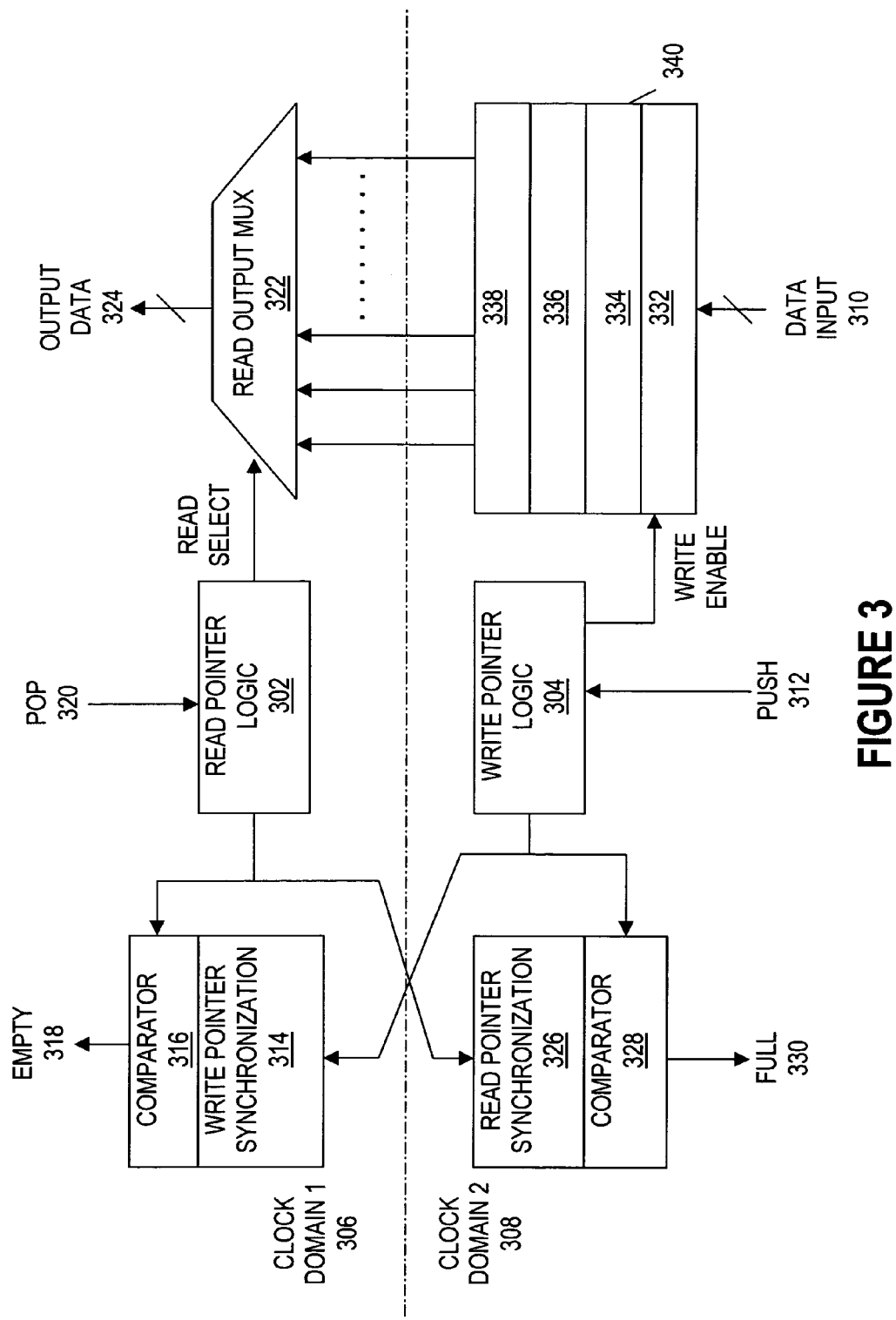
FIG. 3 shows an exemplary implementation of the slave and master FIFO of FIG. 1.

Referring now to FIG. 3, an exemplary implementation of a FIFO data structure capable of being adapted to the slave FIFO 122 (FIG. 1) and the master FIFO 132 (FIG. 1) is shown. Two synchronization units 314 and 326 and a read pointer logic 302 and a write pointer logic 304 exist in separate clock domains 306 and 308, respectively. Each clock domain 306 and 308 may operate at a distinct frequency, as previously discussed. Data may be written to an exemplary FIFO data structure 340 by placing the data onto a data input 310 and asserting the push signal line 312. Once data enters the FIFO 340, the data may be stored into one of the data slots 332, 334, 336, 338. The number and size of the data slots may vary as desired.

After the data is stored in a data slot 332, 334, 336 or 338, the write pointer logic unit 304 preferably sends a control signal containing a value, representing the number of storage slots currently holding data in the exemplary FIFO 340, to a write pointer synchronization unit 314. The write pointer synchronization unit 314 receives the control signal, synchronizes the control signal to avoid meta-stability issues, and extracts the value contained in the control signal. A comparator 316, coupled to the write pointer synchronization unit 314, compares the value from the synchronized control signal with a value extracted from a control signal sent from the read pointer logic 302 to control the empty signal line 318. If the comparator 316 receives a control signal from the write pointer logic 304 that represents an empty FIFO 312 (i.e., zero data slots currently holding data), the empty signal line 318 preferably is asserted. When the control signal represents a non-empty FIFO 312 (i.e., one or more data slots currently holding data), the empty signal line 318 preferably is not asserted.

To read data from the exemplary FIFO 340, a pop signal 320 is preferably asserted. The read pointer logic 302 may receive the pop signal 320 and send a control signal to a read output multiplexer 322. The read output multiplexer 322 preferably is capable of retrieving data from any one data slots 332–338 and transferring the data to an output data bus 324. The read pointer synchronization unit 326 includes a comparator 328 that uses a control signal from the read pointer logic 302 and the write pointer logic 304 to control a full signal line 330. If the comparator 328 receives a notification from the read pointer logic 304 that represents a full FIFO 340 (i.e., the number of data slots in use is equal to the total number of data slots in the exemplary FIFO 340), the full signal line 330 preferably is asserted. When the notification represents a non-full FIFO 340, the full signal line 330 preferably is not asserted.

The exemplary implementation of FIFO 340 does not incur the meta-stability problems associated with typically transfers between multiple clock domains. When data is written to the exemplary FIFO 340, the push signal 312 and the write pointer logic 304 needed to perform the write operation are preferably contained in the clock domain 308. In addition, when data is read from the exemplary FIFO 340, the pop signal 320 and the read pointer logic 302 needed to perform the read operation are preferably contained in the single clock domain 306. Thus, the reading and writing interfaces associated with the exemplary FIFO 312 are operating in distinct clock domains, thereby limiting metastability issue arising from inter-clock domain transfers.

The above discussion is meant to be illustrative of the principles and various embodiments of the present invention. Numerous variations and modifications will become apparent to those skilled in the art once the above disclosure is fully appreciated. It is intended that the following claims be interpreted to embrace all such variations and modifications.

What is claimed is:

1. A system, comprising:
a first clock domain region including a first memory device;
a second clock domain region including a second memory device and a digital signal processing (DSP) subsystem;
a plurality of asynchronous first-in first-out (FIFO) data structures that store data generated from the DSP sub-system, each FIFO including a read interface, a write interface, and one or more data slots; and
wherein the each read interface operates in the first clock domain and each write interface operates in the second clock domain.

2. The system of claim 1, wherein each of the plurality of FIFO data structures generate a full signal indicating whether the FIFO data structure has data occupying all of the one or more data slots.

3. The system of claim 1, wherein each of the plurality of FIFO data structures generate an empty signal indicating whether the FIFO data structure has data slots in which no data is stored.

4. The system of claim 1, further comprising a processor operating in the second clock domain that interacts with the FIFO data structures by submitting requests to store data.

5. The system of claim 1, wherein each of the plurality of FIFO data structures operate independently from each other.

6. The system of claim 1, further comprising buffers that temporarily hold data generated from the DSP sub-system, wherein at least one of the buffers is coupled to each FIFO data structure.

7. The system of claim 1, wherein the second memory device stores data that that is processed by the DSP sub-system, wherein the data comprises a set of data values that are stored in the first memory device.

8. The system of claim 1, wherein the data stored by the plurality of FIFO data structures is encoded with a first protocol that is converted to a second protocol supported by the first memory device.

9. The system of claim 1, wherein the date stored by the plurality of FIFO data structures is utilized by a cache coherency protocol employed in the DSP sub-system.

10. A method for performing asynchronous data transfers, comprising:
generating data from a digital signal processing (DSP) system;
storing the data into a plurality of asynchronous first-in first-out (FIFO) data structures with a write interface;
retrieving the data from the FIFO data structures through a read interface; and
wherein the write and the read interface operate in different clock domains.

11. The method of claim 10, wherein the FIFO data structures comprise one or more data slots that store data in a serial fashion.

12. The method of claim 10, further comprising generating a full signal from each FIFO data structure when the all of the one or more data slots associated with respective FIFO data structure are storing data.

13. The method of claim 10, further comprising generating an empty signal from each FIFO data structure when the all of the one or more data slots associated with respective FIFO data structure are not storing data.

14. The method of claim 10, further comprising converting the generated data to a protocol supported by the FIFO data structure.

15. A system, comprising:
a means for storing data in a first clock domain;
a means for storing data and a means for processing digital signals in a second clock domain;
a plurality of means for asynchronously storing data generated from the means for processing digital signals, each means for asynchronously storing data including a means for reading data, a means for writing data; and
wherein each means for reading data operates in the first clock domain and each means for writing data operates in the second clock domain.

16. The system of claim 15, wherein each means for asynchronously storing data further comprises a means for generating a full signal that indicates whether the means for asynchronously storing data is currently full.

17. The system of claim 15, wherein each means for asynchronously storing data further comprises a means for generating a empty signal that indicates whether the means for asynchronously storing data is currently empty.

18. The system of claim 15, further comprising a mean for temporarily storing data, wherein means for temporarily storing data queues data generated by the means for processing digital signals before the data is stored in one of the plurality of means for asynchronously storing data.

19. The system of claim 15, wherein each means for asynchronously storing data operates independently from each other.

20. The system of claim 15, wherein the plurality of means for asynchronously storing data store data utilized by a means for coherently maintaining cache memory coupled to the means for processing digital signals.

* * * * *